United States Patent
Okazaki et al.

(10) Patent No.: US 8,779,430 B2
(45) Date of Patent: Jul. 15, 2014

(54) SEMICONDUCTOR DEVICE, ACTIVE MATRIX SUBSTRATE, AND DISPLAY DEVICE

(75) Inventors: Shoji Okazaki, Osaka (JP); Takeshi Yaneda, Osaka (JP); Wataru Nakamura, Osaka (JP); Hiromitsu Katsui, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/696,623

(22) PCT Filed: Apr. 27, 2011

(86) PCT No.: PCT/JP2011/060284
§ 371 (c)(1),
(2), (4) Date: Nov. 7, 2012

(87) PCT Pub. No.: WO2011/142265
PCT Pub. Date: Nov. 17, 2011

(65) Prior Publication Data
US 2013/0048999 A1 Feb. 28, 2013

(30) Foreign Application Priority Data
May 10, 2010 (JP) ................................. 2010-108488

(51) Int. Cl.
*H01L 29/04* (2006.01)
*H01L 29/10* (2006.01)
*H01L 29/15* (2006.01)
*H01L 31/00* (2006.01)
*H01L 31/036* (2006.01)
*H01L 29/786* (2006.01)
*G02F 1/1368* (2006.01)
*H01L 29/423* (2006.01)
*H01L 29/417* (2006.01)
*G02F 1/1362* (2006.01)

(52) U.S. Cl.
CPC ........ *H01L 29/78696* (2013.01); *G02F 1/1368* (2013.01); *H01L 29/42384* (2013.01); *H01L 29/41733* (2013.01); *G02F 2001/13629* (2013.01)
USPC ............... 257/59; 257/72; 257/291; 257/353; 257/368; 257/E33.053; 257/E33.062; 257/E29.117

(58) Field of Classification Search
USPC .............. 257/59, 72, 291, 353, 368, E33.053, 257/E33.062, E29.117
See application file for complete search history.

(56) References Cited

U.S. PATENT DOCUMENTS

| 8,040,449 | B2 * | 10/2011 | Seong et al. ................... 349/43 |
| 2002/0044120 | A1 * | 4/2002 | Watanabe et al. ............... 345/87 |
| 2004/0031964 | A1 * | 2/2004 | Morita et al. .................. 257/59 |
| 2005/0236615 | A1 | 10/2005 | Itoh et al. |
| 2009/0091678 | A1 * | 4/2009 | Jeong et al. .................... 349/46 |

FOREIGN PATENT DOCUMENTS

JP 01-133124 U 9/1989

(Continued)

OTHER PUBLICATIONS

Official Communication issued in International Patent Application No. PCT/JP2011/060284, mailed on May 31, 2011.

*Primary Examiner* — Victor A Mandala
(74) *Attorney, Agent, or Firm* — Keating & Bennett, LLP

(57) ABSTRACT

A semiconductor device (18) includes: a gate electrode (102) formed on a substrate (101); a semiconductor layer (104) formed above the gate electrode (102) and including a source region, a drain region, and a channel region; a source electrode (106) connected to the source region above the semiconductor layer (104); and a drain electrode (107) connected to the drain region above the semiconductor layer (104). The semiconductor layer (104) has, at a portion overlapping the drain electrode (107), a protrusion that protrudes outward along an extending direction of a drain line drawn out from the drain electrode (107). At an outside of the channel region sandwiched between the drain electrode (107) and the source electrode (106), the semiconductor layer (104) has an adjustment portion where an outer boundary of the semiconductor layer (104) is positioned more inward than an outer boundary of the gate electrode (102).

20 Claims, 15 Drawing Sheets

(56) References Cited

FOREIGN PATENT DOCUMENTS

| | | | |
|---|---|---|---|
| JP | 02-020830 A | 1/1990 |
| JP | 2000-196098 A | 7/2000 |
| JP | 2002-122885 A | 4/2002 |
| JP | 2005-315969 A | 11/2005 |
| JP | 2008-130967 A | 6/2008 |

* cited by examiner

SEMICONDUCTOR DEVICE, ACTIVE MATRIX SUBSTRATE, AND DISPLAY DEVICE

TECHNICAL FIELD

The present invention relates to a semiconductor device provided with a transistor, and an active matrix substrate and a display device using the semiconductor device.

BACKGROUND ART

TFTs are formed on an active matrix substrate of a liquid crystal display device. In a semiconductor device such as TFTs, in the process of forming lines by wet etching, etching defects tend to occur in the vicinity of step portions at lower layers of the lines. Because of this, in the process of producing the liquid crystal display device, for example, a line resistance is increased due to disconnection or partial disconnection of the lines, which sometimes decreases productivity and display quality. To deal with this, a line configuration has been proposed for suppressing the line width from being narrow in the step portion and the line from being disconnected (e.g., see Patent Document 1). Further, a configuration has been proposed that prevents disconnection of a drain line due to an etching liquid having been penetrated into a semiconductor layer pattern located at a gate/drain intersection and that prevents deterioration in coating properties of a protective insulating film (e.g., see Patent Document 2).

PRIOR ART DOCUMENT

Patent Document

Patent Document 1: JP 2008-130967 A
Patent Document 2: JP 2002-122885 A

DISCLOSURE OF INVENTION

Problem to be Solved by the Invention

However, due to misalignment in a process of forming electrodes of the semiconductor device, electrodes sometimes are displaced from the formation positions, which sometimes changes characteristics of the semiconductor device. In the above-described conventional technique, it is difficult to sufficiently suppress characteristic deteriorations of the semiconductor device due to the misalignment, etc., in the process of forming electrodes.

Therefore, it is an object of the present invention to sufficiently suppresses characteristic deteriorations of the semiconductor device due to misalignment.

Means for Solving Problem

A semiconductor device disclosed in the present application includes: a gate electrode formed on a substrate; a semiconductor layer formed above the gate electrode and including a source region, a drain region, and a channel region; a source electrode connected to the source region above the semiconductor layer; and a drain electrode connected to the drain region above the semiconductor layer. The semiconductor layer has, at a portion overlapping the drain electrode, a protrusion that protrudes outward along an extending direction of the drain line that is drawn out from the drain electrode. At an outside of the channel region sandwiched between the drain electrode and the source electrode, the semiconductor layer has an adjustment portion where an outer boundary of the semiconductor layer is positioned more inward than an outer boundary of the gate electrode.

Further, another semiconductor device disclosed in the present application includes: a gate electrode formed on a substrate; a semiconductor layer formed above the gate electrode and including a source region, a drain region, and a channel region; a source electrode connected to the source region above the semiconductor layer; and a drain electrode connected to the drain region above the semiconductor layer. The semiconductor layer has, at a portion overlapping the source electrode, a protrusion that protrudes outward along an extending direction of the source line that is drawn out from the source electrode. At an outside of the channel region sandwiched between the drain electrode and the source electrode, the semiconductor layer has an adjustment portion where an outer boundary of the semiconductor layer is positioned more inward than an outer boundary of the gate electrode.

In the configuration described above, since the semiconductor layer includes the protrusion and the adjustment portion, characteristics of the semiconductor device hardly change even when misalignment occurs in the process of forming the drain electrode or the source electrode. Therefore, it is possible to sufficiently suppress the characteristic deteriorations of the semiconductor device due to misalignment.

The semiconductor layer further may have, at a portion overlapping the source electrode, a protrusion that protrudes outward along an extending direction of the source line that is drawn out from the source electrode. Thereby, even when the source electrode or the drain electrode is misaligned, it is possible to suppress the characteristic deteriorations of the semiconductor device due to misalignment.

The semiconductor device may be configured so that, at a section where a source line drawn out from the source electrode or a gate line drawn out from the gate electrode crosses another line, a semiconductor layer is provided further between the another line and the source line or the gate line, and the semiconductor layer has a protrusion that protrudes along an extending direction of the source line or the gate line. Thereby, at the intersection of the another line and the source line or the gate line, it is possible to suppress the characteristic deteriorations of the semiconductor device due to misalignment or penetration of an etching liquid.

The source line or the drain line may be formed wider than the other portions of the source line or the drain line, at the portion overlapping the protrusion of the semiconductor layer. Thereby, it is possible to more reliably suppress the characteristic deteriorations due to misalignment.

The gate electrode may have a portion that extends outside a region sandwiched between the source electrode and the drain electrode and protrudes more outward than the semiconductor layer. Thereby, a channel region can be secured also at the outside of the channel region sandwiched between the source electrode and the drain electrode. Consequently, it is possible to further suppress the characteristic deteriorations of the semiconductor device due to misalignment.

In the semiconductor layer, the protrusion and the adjustment portion may be formed continuously. By integrally forming the protrusion and the adjustment portion in the semiconductor layer, it is possible to more reliably suppress the characteristic deteriorations due to misalignment.

The semiconductor device may be configured so that one of the source electrode and the drain electrode has a linear portion, and is arranged opposite to the other electrode so that both sides of the linear portion is surrounded by the other electrode. Thereby, the source electrode and the drain electrode can utilize a space efficiently, and can be configured to suppress the characteristic deteriorations due to misalignment.

The semiconductor device may be configured so that a plurality of the drain electrodes or a plurality of the source electrodes are provided above the gate electrode via the semiconductor layer, and drain lines or source lines respectively are drawn out from the plurality of the drain electrodes or the plurality of the source electrodes. Thereby, it is possible to further suppress the characteristic deteriorations with respect to misalignment.

An active matrix substrate provided with the above-described semiconductor device and a display device provided with the above-described semiconductor device are included in embodiments of the present invention. The above-described semiconductor device can be used as, e.g., a switching element in the active matrix substrate.

Effect of the Invention

According to a semiconductor device disclosed in the present application, the present invention can sufficiently suppress characteristic deteriorations of a semiconductor device due to misalignment.

DESCRIPTION OF THE INVENTION

Figure 1:
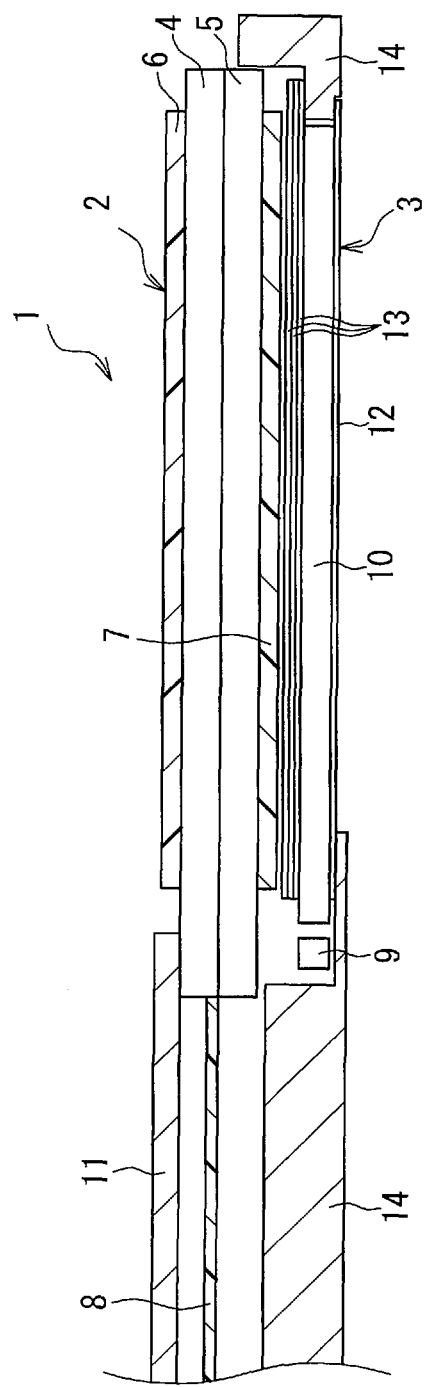
FIG. 1 is a block diagram showing a schematic configuration of a TFT substrate provided in a liquid crystal display device according to Embodiment 1.

Hereinafter, more specific embodiments of the present invention will be described with reference to the drawings. The following embodiments explain configuration examples in which a display device according to the present invention is used as a liquid crystal display device.

Further, for convenience of explanation, the drawings referred to herein are simplified drawings showing exclusively principal members necessary for explaining the present invention, among constituent members of the embodiments of the present invention. A display device according to the present invention therefore possibly includes arbitrary constituent members not shown in the drawings referred to in the present specification. Besides, the dimensions of members in the drawings do not faithfully reflect the actual dimensions of constituent members, dimension ratio of the respective members, etc.

Embodiment 1

Hereinafter, preferred embodiments of a semiconductor device, an active matrix substrate and a display device of the present invention will be described with reference to the drawings. In the following description, the present invention is applied to a transmission type liquid crystal display device.

[Configuration Example of Liquid Crystal Display Device]

FIG. 1 is a view illustrating a liquid crystal display device according to one embodiment of the present invention. In FIG. 1, a liquid crystal display device 1 of the present embodiment is provided with a liquid crystal panel 2 and a backlight device 3. An upper side of the liquid crystal panel 2 in FIG. 1 is defined as a viewing side (display surface side). The backlight device 3 is arranged on a non-display surface side (lower side in FIG. 1) of the liquid crystal panel 2 and generates illumination light for illuminating the liquid crystal panel 2.

The liquid crystal panel 2 includes a color filter substrate 4 and an active matrix substrate 5 of the present invention that constitute a pair of substrates. Polarizing plates 6, 7 are provided on outer surfaces of the color filter substrate 4 and the active matrix substrate 5, respectively. A liquid crystal layer (not shown) is sandwiched between the color filter substrate 4 and the active matrix substrate 5. The color filter substrate 4 and the active matrix substrate 5 are made of a flat plate-shaped transparent glass material or a transparent synthetic resin such as an acrylic resin. The polarizing plates 6, 7 may be made of a resin film such as TAC (triacetyl cellulose) or PVA (polyvinyl alcohol). The polarizing plates 6, 7 are bonded to the corresponding color filter substrate 4 or active matrix substrate 5 so as to cover at least an effective display region of a display surface of the liquid crystal panel 2.

The active matrix substrate 5 constitutes one of the pair of substrates and includes pixel electrodes, TFTs (Thin Film Transistor), etc., that are formed between the active matrix substrate 5 and the liquid crystal layer in accordance with a plurality of pixels included in the display surface of the liquid crystal panel 2 (detailed later). Meanwhile, the color filter substrate 4 constitutes the other of the pair of substrates and includes color filters, counter electrodes, etc., that are formed between the color filter substrate 4 and the liquid crystal layer (not shown).

Further, the liquid crystal panel 2 is provided with a FPC (Flexible Printed Circuit) 8 that is connected to a control device (not shown) that performs drive control of the liquid crystal panel 2. The display surface is driven on a pixel basis by operating the liquid crystal layer on a pixel basis, whereby a desired image can be displayed on the display surface.

Note that the liquid crystal panel 2 can have any liquid crystal mode and any pixel structure. The liquid crystal panel 2 also can have any drive mode. In other words, any liquid crystal panel capable of displaying information can be used as the liquid crystal panel 2.

The backlight device 3 includes light-emitting diodes 9 as light sources, and a light-guiding plate 10 that is arranged to be opposed to the light-emitting diodes 9. Further, the light-emitting diodes 9 and the light-guiding plate 10 are supported by a bezel 14 having an L-shape in cross section, with the liquid crystal panel 2 being located above the light-guiding plate 10. A case 11 is mounted on the color filter substrate 4. Thereby, the backlight device 3 is attached to the liquid crystal panel 2, and they are integrated as the transmission type liquid crystal display device 1 in which illumination light from the backlight device 3 is incident upon the liquid crystal panel 2.

The light-guiding plate 10 is made of a synthetic resin such as a transparent acrylic resin and receives light from the light-emitting diodes 9. A reflecting sheet 12 is disposed on a surface of the light-guiding plate 10 on a side opposite to the liquid crystal panel 2 side (opposed surface side). Further, optical sheets 13 such as a lens sheet and a diffusion sheet are provided on a surface of the light-guiding plate 10 on the liquid crystal panel 2 side (light-emitting surface side). Light from the light-emitting diodes 9 that is guided inside the light-guiding plate 10 in a predetermined light-guiding direction (direction from the left side to the right side in FIG. 1) is transformed into planar illumination light having a uniform brightness, and given to the liquid crystal panel 2.

In the above description, the edge-light type backlight device 3 having the light-guiding plate 10 is used. However, the present embodiment is not limited to this, and a direct type backlight device may be used. Further, a backlight device having a light source other than light-emitting diodes such as cold cathode fluorescent tubes and hot cathode fluorescent tubes also may be used.

[Configuration Example of Liquid Crystal Panel]

Figure 2:
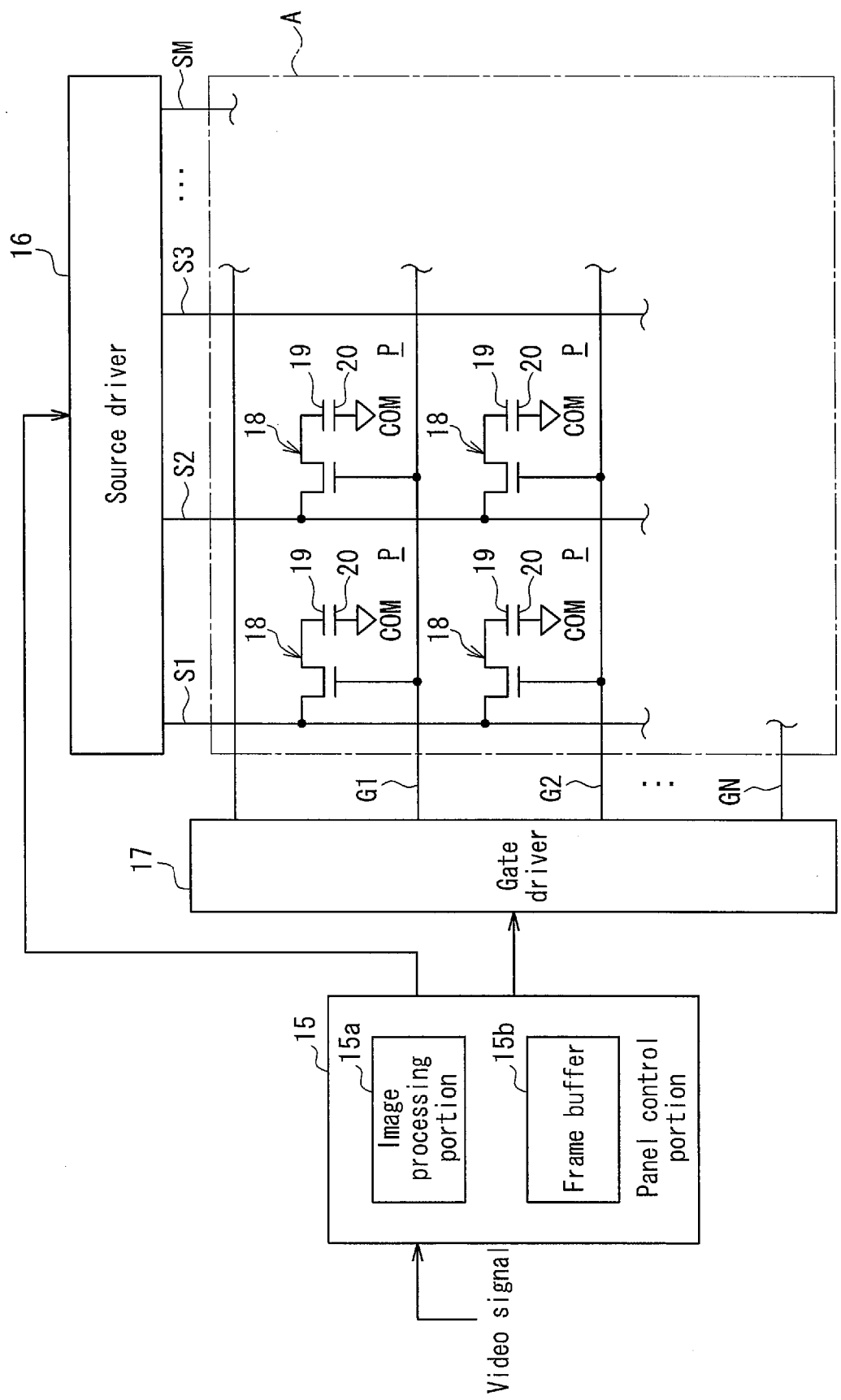
FIG. 2 is an equivalent circuit diagram showing an arrangement of pixels and an optical sensor portion in a pixel region of the TFT substrate.

Next, the liquid crystal panel 2 of the present embodiment will be described specifically also with reference to FIG. 2. FIG. 2 is a diagram illustrating a configuration of the liquid crystal panel shown in FIG. 1.

In FIG. 2, the liquid crystal display device 1 (FIG. 1) is provided with a panel control portion 15 that performs drive control of the liquid crystal panel 2 (FIG. 1) as the display portion that displays information such as characters and images, and a source driver 16 and a gate driver 17 that are operated based on instruction signals from the panel control portion 15.

The panel control portion 15 is placed in the control device and receives video signals from outside of the liquid crystal display device 1. Further, the panel control portion 15 includes an image processing portion 15a that performs predetermined image processing on input video signals so as to generate respective instruction signals to the source driver 16 and the gate driver 17, and a frame buffer 15b that can store one frame of display data contained in the input video signals. The panel control portion 15 performs drive control of the source driver 16 and the gate driver 17 in accordance with input video signals, whereby information in accordance with the video signals is displayed on the liquid crystal panel 2.

The source driver 16 and the gate driver 17 are disposed on the active matrix substrate 5. Specifically, on a surface of the active matrix substrate 5, the source driver 16 is disposed along the horizontal direction of the liquid crystal panel 2 in an outside region of an effective display area A of the liquid crystal panel 2 as a display panel. Further, the gate driver 17 is disposed along the vertical direction of the liquid crystal panel 2 in the outside region of the effective display area A on the surface of the active matrix substrate 5.

Further, the source driver 16 and the gate driver 17 are drive circuits that drive, on a pixel basis, a plurality of pixels P placed on the liquid crystal panel 2 side. The source driver 16 and the gate driver 17 are connected to a plurality of source lines S1-SM (M is an integer of 2 or more; hereinafter, referred to as "S" collectively) and a plurality of gate lines G1-GN (N is an integer of 2 or more; hereinafter, referred to as "G" collectively), respectively. The source lines S and the gate lines G constitute data lines and scanning lines, respectively, that are arrayed in a matrix so as to cross each other on a base material (not shown) made of a transparent glass material or a transparent synthetic resin contained in the active matrix substrate 5. In other words, the source lines S are formed on the base material so as to be parallel to a column direction of the matrix (the vertical direction of the liquid crystal panel 2) and the gate lines G are formed on the base material so as to be parallel to a row direction of the matrix (the horizontal direction of the liquid crystal panel 2).

Furthermore, as described below in detail, an auxiliary capacitance line for generating an auxiliary capacitance is to be connected to the source driver 16, and the source driver 16 is configured to also function as a drive portion for generating an auxiliary capacitance.

Further, in the vicinity of each intersection between the source lines S and the gate lines G, a thin film transistor 18 as a switching element and the above-described pixel P that has a pixel electrode 19 connected to the thin film transistor 18 are provided. Further, in each of the pixels P, a common electrode 20 is opposed to the pixel electrode 19, with the liquid crystal layer of the liquid crystal panel 2 being interposed therebetween. In other words, in the active matrix substrate 5, the thin film transistor 18, the pixel electrode 19 and the common electrode 20 are provided per pixel.

Further, in the active matrix substrate 5, in the respective regions partitioned in a matrix by the source lines S and the gate lines G, a plurality of regions of the pixels P are formed. The plurality of pixels P include red (R), green (G) and blue (B) pixels. The RGB pixels are arranged sequentially in parallel to the gate lines G1-GN in this order, for example. Further, the RGB pixels can display corresponding colors by color filter layers (not shown) provided on the color filter substrate 4 side.

Further, in the active matrix substrate 5, the gate driver 17 sequentially outputs scanning signals (gate signals) with respect to the gate lines G1-GN so as to bring gate electrodes of the corresponding thin film transistors 18 to an ON state based on instruction signals from the image processing portion 15a. Further, the source driver 16 outputs data signals (voltage signals (gradation voltage)) in accordance with the brightness (gradation) of the display image, with respect to the corresponding source lines S1-SM, based on instruction signals from the image processing portion 15a. Hence, the source lines also can be referred to as signal lines.

[Configuration Example of Thin Film Transistor]

Next, a partial configuration of the active matrix substrate 5 of the present embodiment will be described specifically also with reference to FIGS. 3, 4A-4C.

Figure 3:
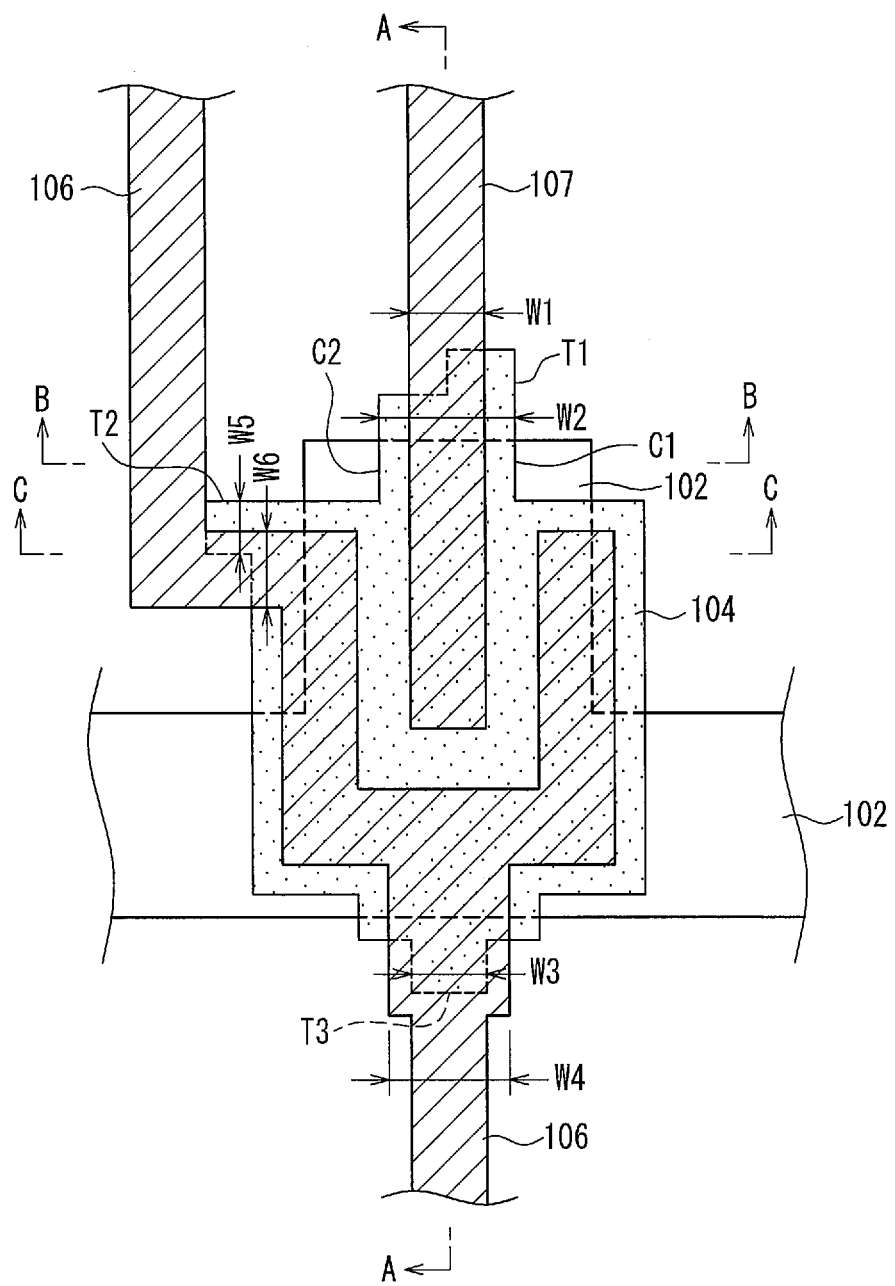
FIG. 3 is a plan view showing a configuration example of a thin film transistor.
Figure 4A:
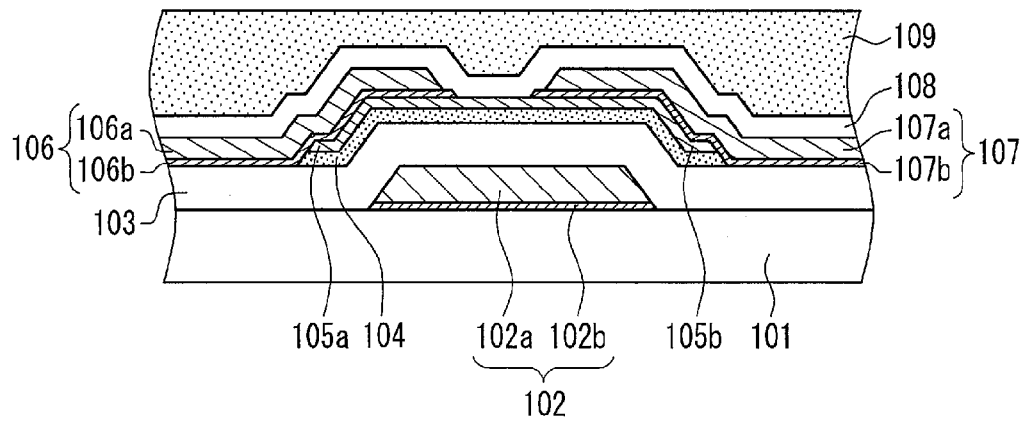
FIG. 4A is a cross-sectional view taken along a line A-A in FIG. 3.
Figure 4B:
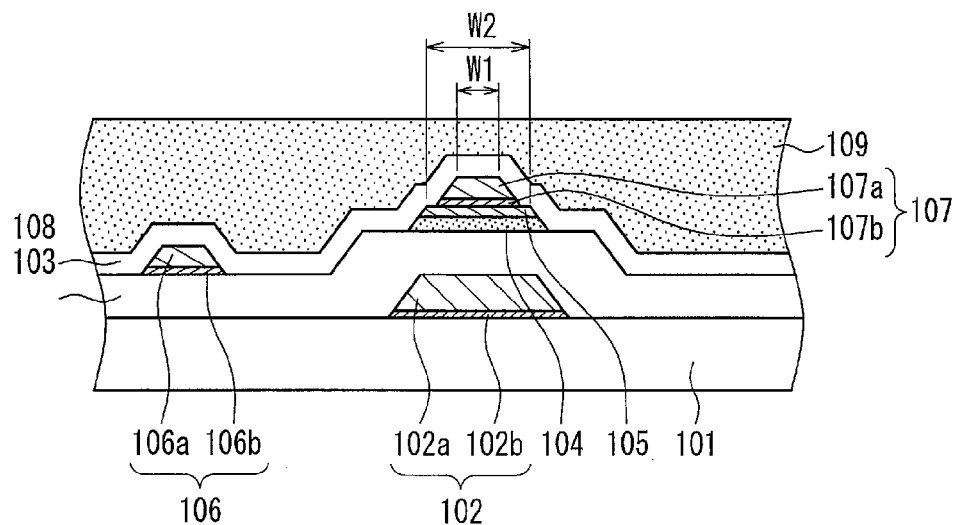
FIG. 4B is a cross-sectional view taken along a line B-B in FIG. 3.
Figure 4C:
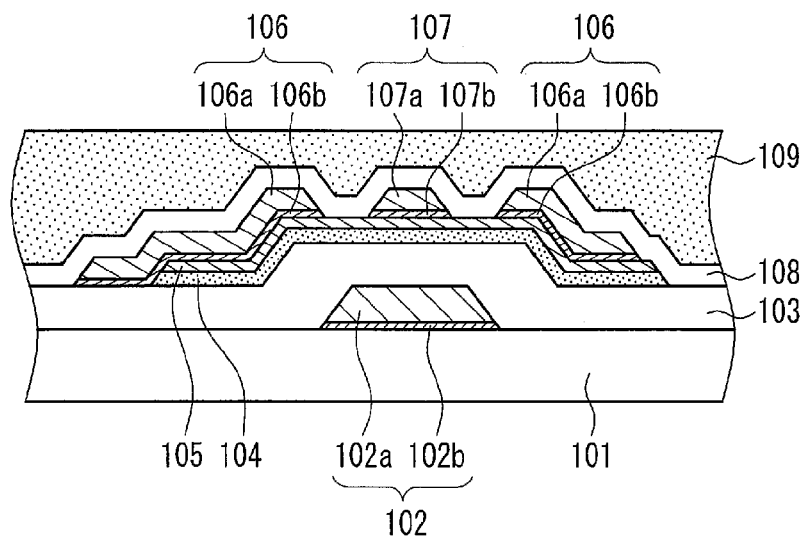
FIG. 4C is a cross-sectional view taken along a line C-C in FIG. 3.

FIG. 3 is a plan view showing a configuration example of the thin film transistor 18. FIG. 4A is a cross-sectional view taken along a line A-A in FIG. 3. FIG. 4B is a cross-sectional view taken along a line B-B in FIG. 3. FIG. 4C is a cross-sectional view taken along a line C-C in FIG. 3.

As shown in FIG. 3, the thin film transistor 18 includes: a gate electrode 102 formed on a base material 101 (substrate) of the active matrix substrate 5; a semiconductor layer 104 formed above the gate electrode 102 and including a source region, a drain region, and a channel region; a source electrode 106 connected to the source region above the semiconductor layer 104; and a drain electrode 107 connected to the drain region above the semiconductor layer 104. The gate electrode 102 is formed integrally with the gate line G, the source electrode 106 is formed integrally with the source line S, and the drain electrode 107 is formed integrally with a drain line. The drain electrode 107 is connected to the pixel electrode 19 via the drain line.

In the semiconductor layer 104, the channel region is formed between the source region and the drain region. Above the channel region, a gap region is provided where neither the source electrode 106 nor the drain electrode 107 is formed. In other words, a portion of the semiconductor layer 104 located under a region sandwiched between the opposed source electrode 106 and the drain electrode 107 serves as the channel region.

The semiconductor layer 104 has, at a portion overlapping the drain electrode 107 in a direction perpendicular to the substrate, a protrusion T1 that protrudes outward along an extending direction of the drain line that is drawn out from the drain electrode 107. Further, the semiconductor layer 104 has, at portions overlapping the source electrode 106, protrusions T2 and T3 that protrude outward along extending directions of the source lines that are drawn out from the source electrode 106.

In the example shown in FIG. 3, the protrusion T1 lies outside the gate electrode 102 along the extending direction of the drain line drawn out from the drain electrode 107, i.e., lies toward the outside of the channel region. The protrusions T2 and T3 lie toward the outside of the gate electrode 102 along the extending directions of the source lines drawn out from the source electrode 106. Incidentally, although ends of the protrusions T1, T2 and T3 are rectangular, outer boundaries of the protrusions T1, T2 and T3 may be curved. For example, a tip of the protrusion may be in an S-shape formed of a continuous protruding portion and a recessed portion.

Further, at the outside of the channel region sandwiched between the drain electrode 107 and the source electrode 106, the semiconductor layer 104 has adjustment portions C1, C2 where an outer boundary of the semiconductor layer 104 is positioned more inward than an outer boundary of the gate electrode 102. In the example shown in FIG. 3, the adjustment portions C1, C2 are portions of the semiconductor layer 104 recessed relatively with respect to the gate electrode 102, in the close region at the outside of the channel region. In this case, the adjustment portions C1, C2 also can be referred to as notches. In the semiconductor layer 104, the protrusion T1 and the adjustment portions C1, C2 are formed continuously. Thus, by providing the semiconductor layer 104 located above the gate electrode 102 with the adjustment portions C1, C2, an OFF current can be reduced and a channel area can be secured.

In the example shown in FIG. 3, notches are provided as the adjustment portions C1, C2 on both sides of the portion of the semiconductor layer 104 to which the drain electrode 107 is connected. Therefore, the semiconductor layer 104 has a shape protruding from the inside to the outside of the gate electrode 102 along the extending direction of the drain line. The protrusion T1 of the semiconductor layer 104 is formed at the tip of the portion protruding outside the gate electrode 102. Thereby, the position at which the drain electrode 107 goes over the outer boundary (edge) of the semiconductor layer 104 is outside the gate electrode 102. Further, a line width W2 positioned before the protrusion T1 of the semiconductor layer 104 that protrudes outside from the gate electrode 102 is larger than a line width W1 of the drain electrode.

Also at a section where the source line is drawn out from the source electrode 106 and extends outside, the semiconductor layer 104 is formed so as to protrude outside the gate electrode 102. The protrusion T2 of the semiconductor layer 104 is formed at the tip of the portion of the semiconductor layer 104 that protrudes outside the gate electrode 102. A line width W6 of the source line drawn out from the source electrode 106 is larger than a line width W5 of the protrusion T2 of the semiconductor layer that protrudes outside the gate electrode. At a section where another source line is drawn out from the source electrode 106, a line width W4 of the protruding portion of the source electrode 106 is larger than a line width W3 of the protrusion T3 of the semiconductor layer. Further, at the overlapping portion of the source electrode 106 and the protrusion T3 of the semiconductor layer 104, the line width of the source electrode 106 is larger than that of the source line. Thereby, changes in characteristics due to misalignment can be suppressed further. Incidentally, also at the overlapping portion of the source electrode 106 and the protrusion T2, the line width of the source electrode can be set larger than that of the source line. Further, also at an overlapping portion of the drain line drawn out from the drain electrode 107 which overlaps the protrusion T1 of the semiconductor layer 104, the line width of the drain line of the overlapping portion can be set larger than those of the other portions of the drain line.

In FIG. 3, the drain electrode 107 is formed linearly, and the source electrode 106 is arranged so as to surround both sides and a tip of the linear drain electrode 107. Under a section where the drain electrode 107 and the source electrode 106 are opposed to each other, the semiconductor layer 104 is formed. A portion of the semiconductor layer 104 located under the region sandwiched between the drain electrode 107 and the source electrode 106 surrounding the drain electrode 107 serves as the channel region. The gate electrode 102 extends outside the region sandwiched between the source electrode 106 and the drain electrode 107, and has a portion protruding more outward than the semiconductor layer 104. In other words, the gate electrode 102 is formed so as to have a portion whose end is positioned more outward than the semiconductor layer 104 in the extending direction of the drain electrode 107. Thereby, it is possible to suppress generation of pseudo channels at the outside of the channel region sandwiched between the source electrode 106 and the drain electrode 107.

Note that the configuration of the thin film transistor is not limited to the configuration example shown in FIG. 3. For example, in the example shown in FIG. 3, the protrusion of the semiconductor layer 104 is provided at the overlapping portion of the semiconductor layer 104 and the drain electrode 107 and the overlapping portion of the semiconductor layer 104 and the source electrode 106. However, the protrusion may be provided at one of these overlapping portions. Further, the way the source electrode 106 overlaps the semiconductor layer 104 may be as follows: as in the vicinity of the protrusion T3, both sides of the end of the semiconductor layer 104 are covered with the source electrode 106; and as in the protrusion T2, part of the end of the semiconductor layer 104 extends outside the source electrode 106. Further, the combination is not limited particularly. The same applies to the way the drain electrode 107 overlaps the semiconductor layer 104.

[Cross-Sectional Shape]

As shown in FIG. 4A, the gate electrode 102 is formed by, for example, placing a lower-layer gate electrode 102b of a titanium (Ti) film and an upper-layer gate electrode 102a of a copper (Cu) film on the base material 101 of the active matrix substrate 5. A gate insulating film 103 is placed on the base material 101 so as to cover the gate electrode 102. The gate insulating film 103 is made of silicon nitride (SiNx), for example. An amorphous silicon layer as the semiconductor layer 104 and electrode contact layers 105a, 105b are formed on the gate insulating film 103. An island composed of the semiconductor layer 104 and the electrode contact layer 105 is formed. The electrode contact layers 105a, 105b are made of n+ amorphous silicon, for example. Thus, the source electrode 106 composed of, e.g., a lower-layer source electrode 106b of a titanium film and an upper-layer source electrode 106a of a copper (Cu) film is formed on the electrode contact layer 105a. The source electrode 106 is connected to the source region of the semiconductor layer 104 via the electrode contact layer 105a.

Meanwhile, the drain electrode 107 composed of, e.g., a lower-layer drain electrode 107b of a titanium film and an upper-layer drain electrode 107a of an aluminum film is formed on the electrode contact layer 105b. The drain electrode 107 is connected to the drain region of the semiconductor layer 104 via the electrode contact layer 105b. Further, in the semiconductor layer 104, the channel region is formed between the source region and the drain region. Above the channel region, the electrode contact layers 105a, 105b are not formed but a predetermined gap is provided.

Further, in the thin film transistor 18, a protective layer 108 and an interlayer insulating film 109 are formed sequentially so as to cover the source electrode 106 and the drain electrode 107. The protective layer 108 is made of silicon nitride (SiNx), for example. The interlayer insulating film 109 is made of a photosensitive interlayer insulating film material prepared by mixing a photosensitizer in an insulating material such as a novolac resin, for example. Although the interlayer insulating film 109 is illustrated, the thin film transistor may have another configuration without the interlayer insulating film 109.

In the example shown in FIG. 4A, a section at which the drain electrode 107 goes over the step at the end of the semiconductor layer 104 is outside the gate electrode 102 (right side in FIG. 4A). Further, a section at which the source electrode 106 goes over the step at the end of the semiconductor layer 104 is outside the gate electrode 102 (left side in FIG. 4A).

In FIG. 4B, the semiconductor layer 104 having a line width W2 is formed on the gate electrode 102 via the gate insulating film 103. The electrode contact layer 105 is formed on the semiconductor layer 104, and the drain electrode 107 having a line width W1 narrower than W2 is formed on the electrode contact layer 105. In the cross section shown in FIG. 4B, the source electrode 106 overlaps neither the gate electrode 102 nor the semiconductor layer 104, and is formed on the gate insulating film 103. Incidentally, the source electrode 106 shown in FIG. 4B also can be referred to as the source line. The protective layer 108 and the interlayer insulating film 109 are formed sequentially so as to cover the source electrode 106 and the drain electrode 107.

In FIG. 4C, the semiconductor layer 104 is formed above the gate electrode 102 via the gate insulating film 103 so as to cover the gate electrode 102. Specifically, both ends of the semiconductor layer 104 are positioned more outward than both ends of the gate electrode 102. In FIG. 4C, the source region is positioned inward by a predetermined length from the both ends of the semiconductor layer 104, the drain region is positioned at a center portion thereof, and the channel region is positioned at portions thereof sandwiched between the drain region and the source region. The drain region and the source region are provided with the electrode contact layers 105, and connected to the drain electrode 107 and the source electrode 106, respectively. The source electrode 106 is formed so as to extend outward from one end of the semiconductor layer 104 (end on the left side in FIG. 4C). The source electrode 106 extending outward is connected to the source line. The drain electrode 107 is formed in the center portion of the semiconductor layer 104. Between the drain electrode 107 in the center portion and the source electrodes 106 located on both sides of the semiconductor layer 104, the electrode contact layer 105 is not formed but a gap is provided. The region below the gap is the channel region.

[Production Process]

Here, an exemplary production process of an active matrix substrate having the thin film transistor 18 shown in FIG. 3 and FIGS. 4A-4C will be described.

First, the gate electrode 102 serving as the scanning line is formed on the base material 101. In the present embodiment, a Ti film of 20 nm to 150 nm that is the lower-layer gate electrode 102b and a Cu film of 200 nm to 500 nm that is the upper-layer gate electrode 102a are deposited by a sputtering method, and the deposited films are patterned by photolithography, wet etching, and resist peeling cleaning. Thus, the gate electrode 102 made of Cu/Ti films is formed.

Next, the gate insulating film 103 that is an insulating layer and the semiconductor layer 104 (channel layer) are formed. For example, by a CVD method, a SiNx layer having a thickness of 200 nm to 500 nm, an amorphous Si layer having a thickness of 30 nm to 300 nm, and an n+ amorphous Si layer having a thickness of 20 nm to 150 nm respectively are formed as the gate insulating film 103, the semiconductor layer 104, and the electrode contact layer 105 doped with n-type impurities at a high concentration. Then, the electrode contact layer 105 and the semiconductor layer 104 are patterned by photolithography, dry etching, and resist peeling cleaning.

Next, the drain electrode 107 and the source electrode 106 serving as the signal line are formed. In the present embodiment, Ti films of 20 nm to 150 nm that are the lower-layer drain electrode 107b and the lower-layer source electrode 106b, and Cu films of 100 nm to 400 nm that are the upper-layer drain electrode 107a and the upper-layer source electrode 106a are deposited by a sputtering method, and the deposited films are patterned by photolithography, wet etching, and resist peeling cleaning. Thus, the signal line and the drain electrode that are made of Cu/Ti films are formed. Further, the n+ amorphous Si in the channel region is removed by dry etching.

Next, the protective layer 108 and the interlayer insulating film 109 are formed. In the present embodiment, a SiNx film of 100 nm to 700 nm are deposited by a CVD method. Next, a photosensitive interlayer insulating film material is patterned by photolithography, and the protective layer 108 and the interlayer insulating film 109 are patterned by dry etching.

Next, the pixel electrode is formed. In the present embodiment, an ITO film of 50 nm to 200 nm is deposited by a sputtering method, and the deposited film is patterned by photolithography, wet etching, and resist peeling cleaning. Thus, the pixel electrode made of the ITO film is formed.

The above is an exemplary production process of the active matrix substrate 5. Hereinafter, an exemplary production process of the color filter substrate 4 will be described.

First, a black matrix and color filters are formed on a substrate. For example, a black matrix and color filter layers of red, green and blue are formed by photolithography using a photosensitive material. Next, a counter electrode is formed. For example, an ITO film of 50 nm to 200 nm is deposited by a sputtering method, and the deposited film is patterned by photolithography and wet etching. Thus, the counter electrode is formed. Further, a photo spacer is formed. For example, a photo spacer can be formed by photolithography using a photosensitive material.

The above-described active matrix substrate 5 and the color filter substrate 4 are bonded to each other. First, for example, as an orientation film, polyimide is formed by a printing method on the active matrix substrate 5 and the color filter substrate 4 (counter substrate) produced by the above-described processes. After sealing agent printing and liquid crystal dropping, the active matrix substrate 5 and the color filter substrate 4 are bonded to each other. Then, the bonded substrates are split by dicing.

Modified Example 1

Figure 5:
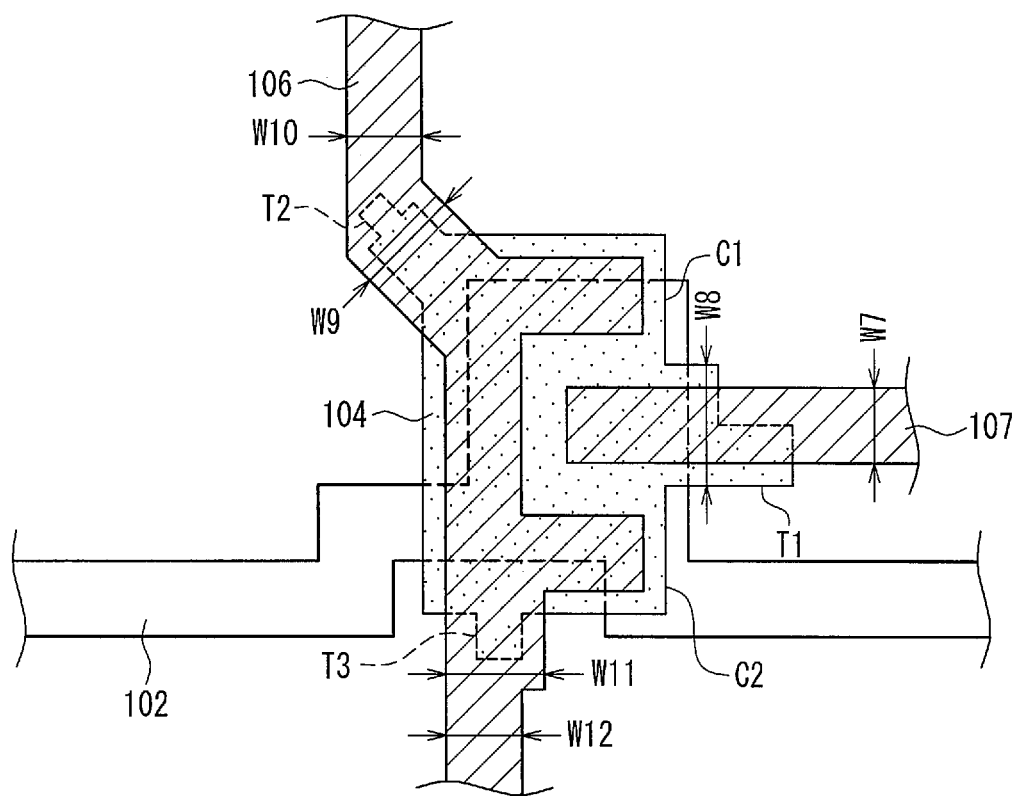
FIG. 5 is a plan view showing a modification example of a configuration of a thin film transistor.

FIG. 5 is a plan view showing a modification example of the configuration of the thin film transistor 18. In the example shown in FIG. 5, the drain electrode 107 is formed so as to extend parallel to the extending direction of gate lines drawn out from the gate electrode 102. The source electrode 106 is arranged so as to surround both sides and a tip of the drain electrode 107 extending linearly. The channel region of the semiconductor layer 104 is formed under the region sandwiched between the drain electrode 107 and the source electrode 106 surrounding the drain electrode 107. Two source lines extending in a direction perpendicular to the extending direction of the gate lines are connected to the source electrode 106.

Further, the semiconductor layer 104 has a portion that protrudes in the extending direction of the drain electrode 107. In the tip of the protruding portion, the semiconductor layer 104 has, at a portion overlapping the drain electrode 107, the protrusion T1 that protrudes in the extending direction of the drain line. A width W8 of the protruding portion positioned before the protrusion T1 is larger than a width W7 of the drain line, in the direction perpendicular to the extending direction of the drain electrode 107. Further, at the outside of the channel region sandwiched between the drain electrode 107 and the source electrode 106, the semiconductor layer 104 has the adjustment portions C1, C2 where the outer boundary of the semiconductor layer 104 is positioned more inward than the outer boundary of the gate electrode 102.

Further, in the sections where the source lines are drawn out from the source electrode 106, the semiconductor layer 104 has, at the portions overlapping the source electrode 106, the protrusions T2 and T3 that protrude in the extending directions of the source lines. Further, at the overlapping portion of the protrusion T2 and the source electrode 106, a line width W9 of the source electrode 106 is larger than a line width W10 of the source line. Similarly, at the overlapping portion of the protrusion T3 and the source electrode 106, a line width W11 of the source electrode 106 is larger than a line width W12 of the source line.

[Description of Effects]

As in the above-described embodiment, since the semiconductor layer 104 has the protrusions T1, T2, T3 and the adjustment portions C1, C2, disconnection of the source electrode or the drain electrode and generation of pseudo channel regions can be suppressed even when misalignment in the X or Y direction occurs between the gate electrode pattern, the source and drain electrode patterns, and the semiconductor layer pattern. Consequently, changes in characteristics of the thin film transistor 18 due to misalignment can be suppressed.

Figure 6:
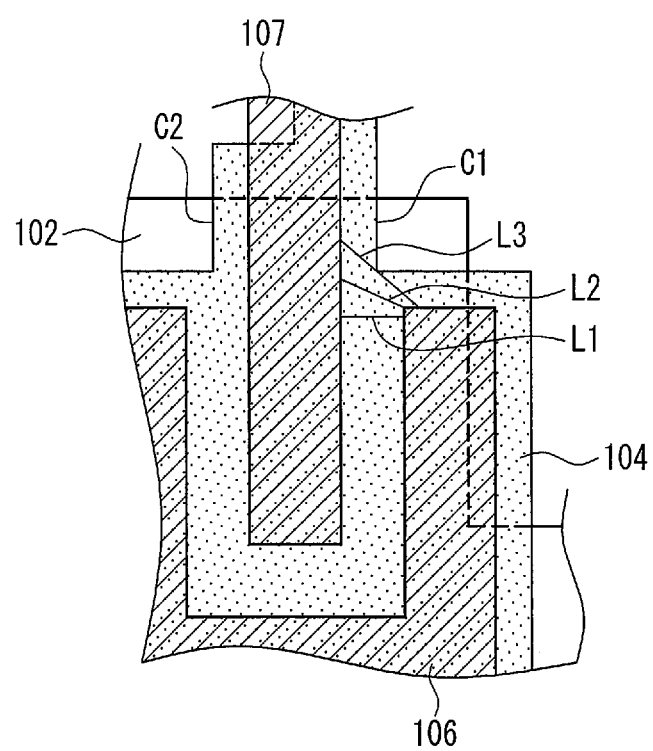
FIG. 6 is an enlarged view of the vicinity of an adjustment portion shown in FIG. 3.

For example, by providing the semiconductor layer 104 with the adjustment portions C1, C2, the OFF current can be reduced and the channel area can be secured. Because of this, it is possible to obtain favorable OFF characteristics as TFT characteristics even when misalignment occurs. FIG. 6 is an enlarged view of the vicinity of the adjustment portion C1 shown in FIG. 3. As shown in FIG. 6, the channel region can be secured not only at a portion L1 where the drain electrode 107 and the source electrode 106 are opposed to each other in the direction perpendicular to their extending direction, but also at portions L2, L3 where the drain electrode 107 and the source electrode 106 are opposed obliquely. In this case, if the semiconductor layer 104 does not have notches, i.e., the adjustment portions C1, C2 (if the semiconductor layer 104 is formed on all of the gate electrode 102, a gate signal cannot reach the semiconductor layer 104, whereby favorable OFF characteristics as TFT characteristics cannot be obtained.

Further, by providing the semiconductor layer 104 with the protrusion T1, in the overlapping portion of the drain electrode 107 and the semiconductor layer 104, the length of the step of the semiconductor layer 104 over which the drain electrode 107 passes is increased and the directional diversity of the step is increased. Thereby, even when misalignment occurs, it is highly likely that etching defects between the drain electrode 107 and the edge of the semiconductor layer 104 remain at one section, whereby disconnection of the drain electrode 107 or the drain line can be suppressed.

Figure 7:
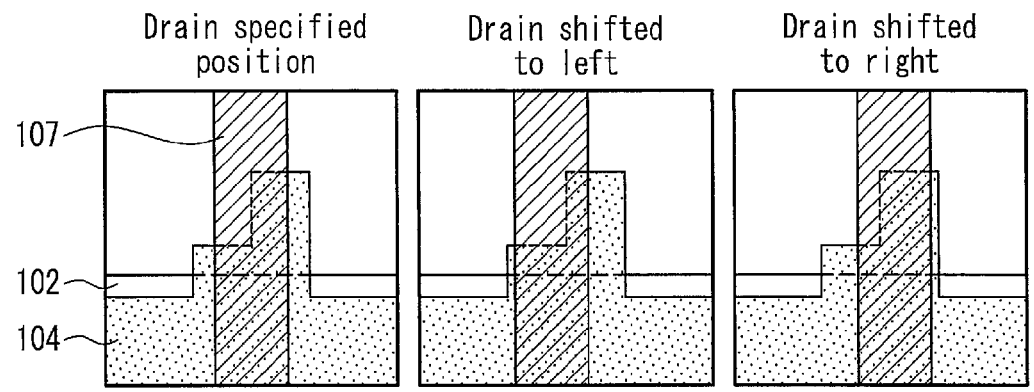
FIG. 7 shows plan views illustrating exemplary cases where a drain electrode shown in FIG. 3 is displaced from a specified position.

FIG. 7 shows plan views illustrating exemplary cases where the drain electrode 107 shown in FIG. 3 is displaced from the specified position. In FIG. 7, the view on the left shows the specified position of the drain electrode 107, the center view shows an exemplary case where the drain electrode 107 is shifted to a negative direction of an x-axis (left direction in the view), and the view on the right shows an exemplary case where the drain electrode 107 is shifted to a positive direction of the x-axis (right direction in the view). As illustrated, even when the pattern of the drain electrode 107 is displaced with respect to the semiconductor layer 104 in the x-axis direction (transverse direction in the view), it is possible to sufficiently secure the overlapping portion of the edge (step) of the semiconductor layer 104 and the drain electrode 107, whereby an effect of preventing disconnection can be obtained. In this case, the line length of the drain electrode 107 changes little. The line resistance is less likely to increase. Note that the same effect can be obtained also in the displacement in a y-axis direction.

Similarly, by providing the semiconductor layer 104 with the protrusions T2, T3, in the overlapping portion of the source electrode 106 and the semiconductor layer 104, the length of the step of the semiconductor layer 104 over which the source electrode 106 passes is increased and the directional diversity of the step is increased. Thereby, it is highly likely that etching defects between the source electrode 106 and the edge of the semiconductor layer 104 remain at one section, whereby disconnection of the source electrode 106 or the source line can be suppressed.

Figure 8:
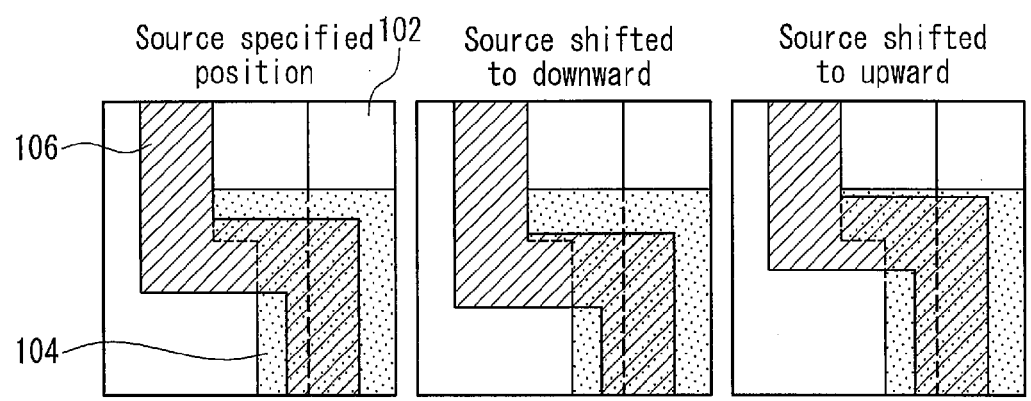
FIG. 8 shows plan views illustrating exemplary cases where a source electrode shown in FIG. 3 is displaced from a specified position.

FIG. 8 shows plan views illustrating exemplary cases where the source electrode 106 shown in FIG. 3 is displaced from the specified position. In FIG. 8, the view on the left shows the specified position of the source electrode 106, the center view shows an exemplary case where the source electrode 106 is shifted to a negative direction of the y-axis (downward direction in the view), and the view on the right shows an exemplary case where the source electrode 106 is shifted to a positive direction of the y-axis (upward direction in the view). As illustrated, even when the pattern of the source electrode 106 is displaced with respect to the semiconductor layer 104 in the y-axis direction (longitudinal direction in the view), it is possible to sufficiently secure the overlapping portion of the edge (step) of the semiconductor layer 104 and the source electrode 106, whereby an effect of preventing disconnection can be obtained. Note that the same effect can be obtained also in the displacement in the x-axis direction.

Further, in order to increase the above-described effect further, it is preferable to determine shapes and sizes of the protrusions T1, T2, T3 in view of an alignment margin for design, for example.

[Configuration Example of Protrusion]

FIGS. 9A-9G are views showing configuration examples of the protrusion of the semiconductor layer 104. As shown in FIGS. 9A-9G, the protrusion can have various shapes. Note that the shape of the protrusion is not limited to the examples shown in FIGS. 9A-9G described below. Further, although FIGS. 9A-9G show the exemplary overlapping portions of the drain electrode 107 and the semiconductor layer 104, the overlapping portion of the source electrode 106 and the semiconductor layer 104 can be configured similarly.

Figure 9A:
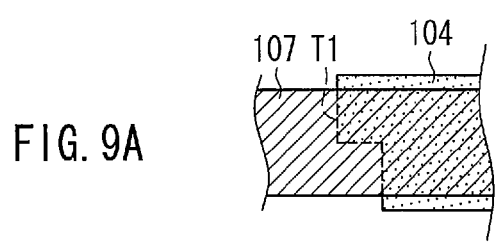
FIGS. 9A-9G are views showing configuration examples of a protrusion of a semiconductor layer.
Figure 9B:
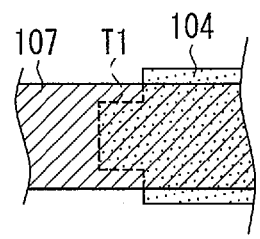
Figure 9C:
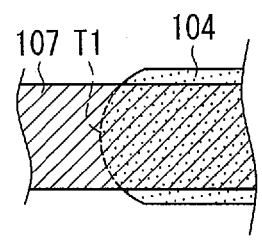

In the example shown in FIG. 9A, the protrusion T1 is formed by a rectangle that protrudes in the extending direction of the drain electrode 107. Part of the protrusion T1 extends outside the drain electrode 107. In the example shown in FIG. 9B, the protrusion T1 is formed so that the drain electrode 107 overlaps the whole protrusion T1. In the example shown in FIG. 9C, the outer boundary of the protrusion T1 is formed by an arc that protrudes in the extending direction of the drain electrode 107.

Figure 9D:
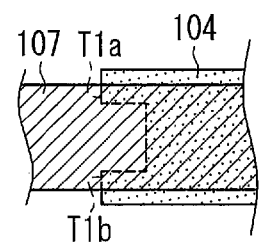
Figure 9E:
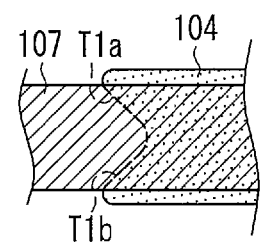
Figure 9F:
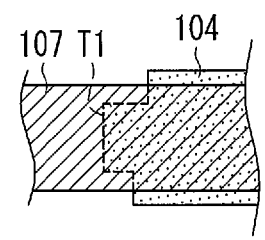
Figure 9G:
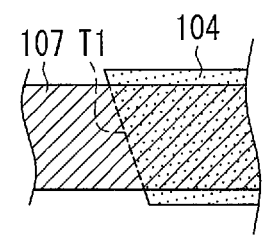

In the example shown in FIG. 9D, two rectangular protrusions T1a, T1b are formed. Part of each of the protrusions T1a, T1b extends outside the drain electrode 107. In the example shown in FIG. 9E, in the two protrusions T1a, T1b, the outer boundary of the semiconductor layer 104 is formed by a curved line. In the example shown in FIG. 9F, roots at both sides of the protrusion T1 are displaced from each other in the extending direction of the drain electrode. In the example shown in FIG. 9G, by forming the outer boundary of the semiconductor layer 104 with a straight line that is inclined with respect to the extending direction of the drain electrode 107, the protrusion T1 is formed.

[Configuration Example of Adjustment Portion]

FIGS. 10A-10H are views showing configuration examples of the adjustment portion of the semiconductor layer 104. As shown in FIGS. 10A-10H, the adjustment portion can have various shapes in accordance with the shapes of the source electrode 106 and the drain electrode 107. Note that the shape of the protrusion is not limited to the examples shown in FIGS. 10A-10H described below.

Figure 10A:
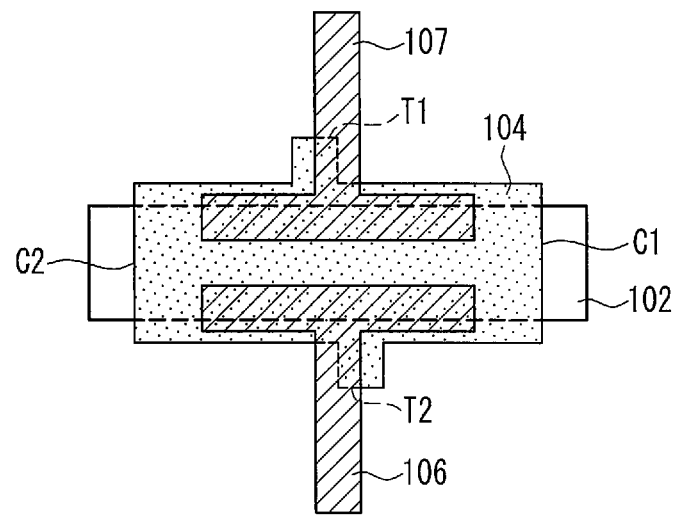
FIGS. 10A-10H are views showing configuration examples of the adjustment portion of the semiconductor layer.

In the example shown in FIG. 10A, the linear source electrode 106 and the linear drain electrode 107 are opposed to each other. FIG. 10A shows one exemplary configuration in which the channel has a linear shape. The source line and the drain line are drawn out from the source electrode 106 and the drain electrode 107, so as to extend in the direction perpendicular to the extending directions of the opposed source electrode 106 and the drain electrode 107, respectively. That is, both of the source electrode 106 and the drain electrode 107 have a T-shape. The semiconductor layer 104 is formed under a region where the source electrode 106 and the drain electrode 107 are opposed to each other. Further, the semiconductor layer 104 has the protrusion T1 that protrudes along the extending direction of the drain line and the protrusion T2 that protrudes along the extending direction of the source line. In the extending direction of the opposed source electrode 106 and the drain electrode 107, both ends of the semiconductor layer 104 are positioned more inward than both ends of the gate electrode 102. Specifically, portions in the outer boundary of the semiconductor layer 104 positioned more inward than the outer boundary of the gate electrode 102 serve as the adjustment portions C1, C2.

Figure 10B:
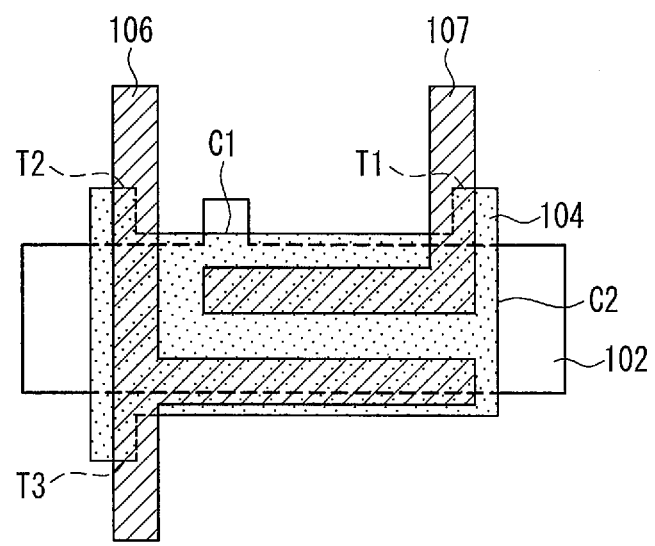

In the example shown in FIG. 10B, there are provided the source electrode 106 having a linear portion and the drain electrode 107 having a linear portion extending parallel to the linear portion of the source electrode 106. From one end side (left end in FIG. 10B) of the linear portion of the source electrode 106, source lines extend in two opposite directions in the direction perpendicular to the linear portion (upward and downward directions in FIG. 10B). From the other end side (right side in FIG. 10B) of the linear portion of the drain electrode 107, a drain line extends in one direction perpendicular to the linear portion (upward direction in FIG. 10B). That is, the source electrode 106 has a T-shape, and the drain electrode 107 has a L-shape. Note that the drain electrode 107 is terminated before reaching the source line, whereby a L-shaped region that includes a region between the terminal of the drain electrode 107 and the source electrode 106 and a linear region sandwiched between the linear portion of the source electrode 106 and the linear portion of the drain electrode 107 serves as a channel region. That is, the channel has a L-shape. In the opening portions of the channel region, i.e., in the vicinity of the outside of the channel region end where neither the source electrode 106 nor the drain electrode 107 is formed, the adjustment portions C1, C2 where the outer boundary of the semiconductor layer 104 is positioned more inward than the outer boundary of the gate electrode 102 are provided. In the adjustment portion C1, the gate electrode 102 protrudes outside the semiconductor layer 104. In the adjustment portion C2, the end of the gate electrode 102 is positioned more outward than the end of the semiconductor layer 104.

Figure 10C:
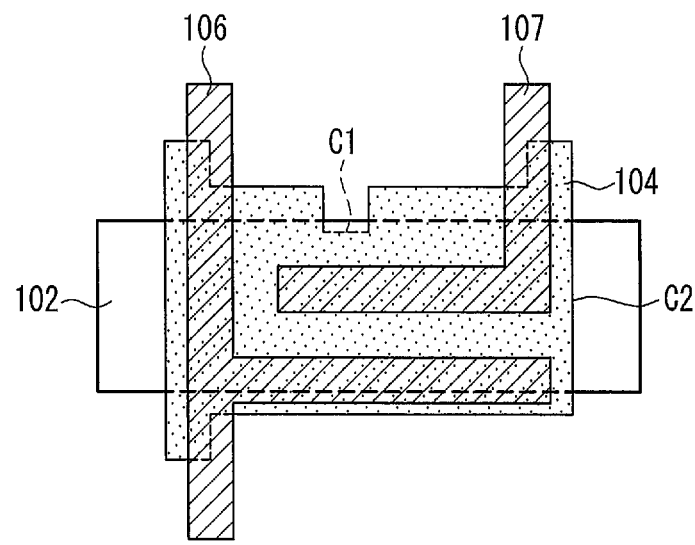

In the example shown in FIG. 10C, the adjustment portion C1 at the outside of the region (channel region) sandwiched between the terminal portion of the linear portion of the drain electrode 107 and the source electrode 106 is configured differently from the adjustment portion C1 shown in FIG. 10B. Specifically, in the adjustment portion C1 shown in FIG. 10C, the semiconductor layer 104 is recessed inward beyond the edge of the gate electrode 102. Thus, the adjustment portion C1 can be formed by the recessed portion that is recessed more inward than the outer boundary of the gate electrode 102.

Figure 10D:
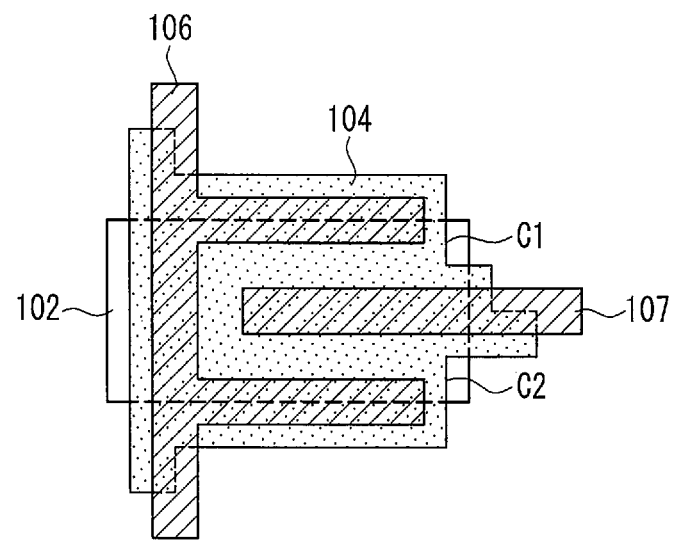

In the example shown in FIG. 10D, the drain electrode 107 has a linear portion extending in the same direction as the drain line. The source electrode 106 is arranged so as to surround both sides and a tip of the linear portion of the drain electrode 107. In this case, the channel has a U-shape (square-cornered U shape). Specifically, the source electrode 106 has two parallel linear portions that are parallel to the drain electrode 107 and a vertical linear portion that connects these two linear portions and extends in the direction perpendicular to the drain electrode 107. Source lines are drawn out along the vertical linear portion. In the extending direction of the drain electrode 107, portions of the semiconductor layer 104 where the edge of the semiconductor layer 104 is positioned more inward than the outer edge of the gate electrode 102 serve as the adjustment portions C1, C2. In other words, a portion of the semiconductor layer 104 that overlaps the drain electrode 107 protrudes along the drain electrode 107, and notches are formed on both sides of this protruding portion. In each of the notches, the edge of the semiconductor layer 104 is positioned more inward than the edge of the gate electrode 102, which creates the adjustment portions C1, C2. In the example shown in FIG. 10D, the end (edge) of the gate electrode 102 on the side to which the drain electrode 107 is drawn out is positioned more outward (the side to which the drain electrode is drawn out) than the ends of the linear portions of the source electrode 106 arranged on both sides of the drain electrode 107.

Incidentally, regarding the configuration in which one of the drain electrode and the source electrode is arranged so as to surround the other electrode, the surrounding electrode may have, e.g., a U-shape, a horseshoe shape, or an arc shape, other than the configuration shown in FIG. 10D.

Figure 10E:
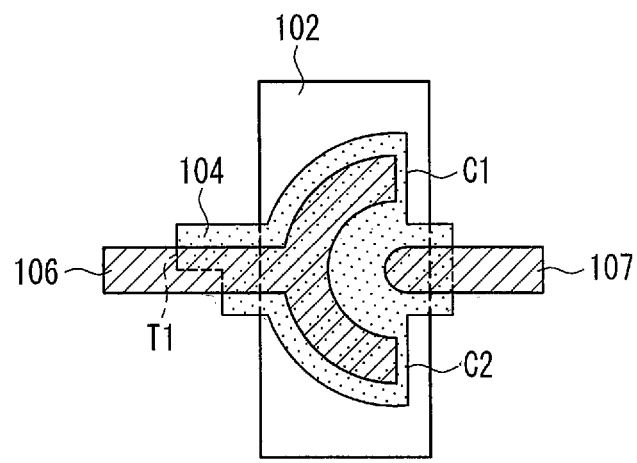

In FIG. 10E, an arc-shaped source electrode 106 that surrounds a tip of the linear drain electrode 107 is formed. The semiconductor layer 104 is formed under a region that includes all of the arc-shaped source electrode 106, the tip of the drain electrode 107 and a region sandwiched therebetween. The channel has an arc-shape. The outer boundary of the semiconductor layer 104 is positioned outside the gate electrode 102 at the portion overlapping the drain electrode 107, but enters inside the gate electrode 102 on both sides of the drain electrode 107. Thereby, the adjustment portions C1, C2 are formed on the both sides of the drain electrode 107. Further, the outer boundary of the semiconductor layer 104 is positioned outside the gate electrode 102 also at the portion overlapping the source electrode 106, but enters inside the gate electrode 102 on both sides of the source electrode 106. In the example shown in FIG. 10E, the outer boundary of the semiconductor layer 104 includes, at the portion overlapping the source electrode 106, the protrusion T1 that protrudes along the source line, but does not include a protrusion at the portion overlapping the drain electrode 107. In this manner, the protrusion of the semiconductor layer 104 may be provided only on the source electrode 106 side.

Figure 10F:
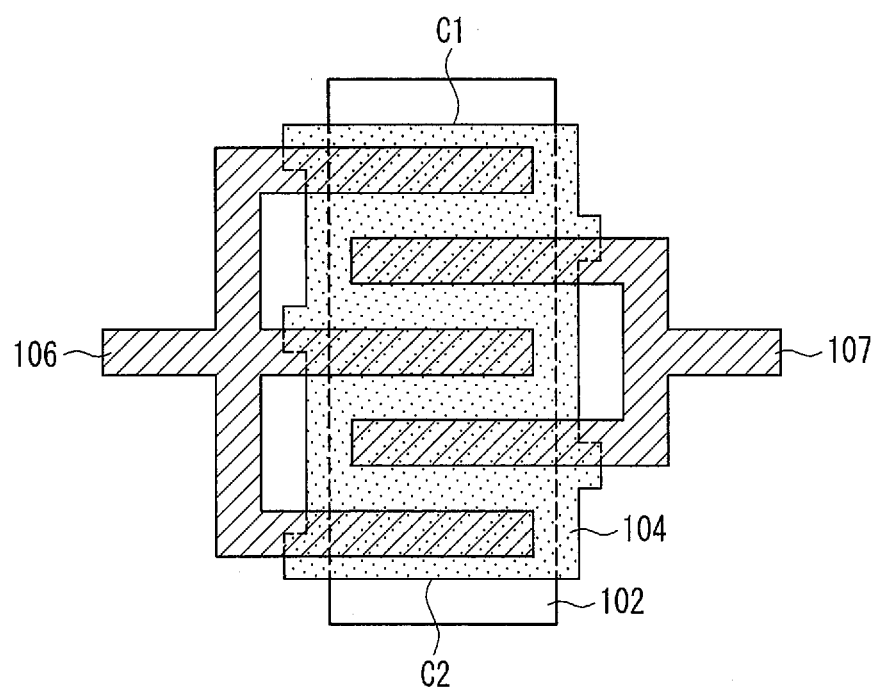

In the example shown in FIG. 10F, linear portions of the source electrode 106 and linear portions of the drain electrode 107 parallel to the linear portions of the source electrode 106 are arranged alternately. Specifically, three linear portions of the source electrode 106 and two linear portions of the drain electrode 107 provided therebetween are arranged. A region sandwiched between the linear portions of the source electrode 106 and the linear portions of the drain electrode 107 (a region where the source electrode 106 and the drain electrode 107 are arranged alternately) serves as a channel region. The channel has a comb shape. The three linear portions of the source electrode 106 are connected to one source line. The two linear portions of the drain electrode 107 are connected to one drain line. A whole region that includes the linear portions of the source electrode 106, the liner portions of the drain electrode 107 and the channel region is placed on the gate electrode 102 and the semiconductor layer 104. Specifically, the outer boundary of the semiconductor layer 104 and the outer boundary of the gate electrode 102 are positioned outside said region. Further, the gate electrode 102 is formed so as to extend more outward than the semiconductor layer 104 in the direction perpendicular to the linear portions of the source electrode 106 or the drain electrode 107. Thereby, the adjustment portions C1, C2 where the outer boundary of the semiconductor layer 104 is positioned more inward than the outer boundary of the gate electrode 102 is formed outside the channel region.

Figure 10G:
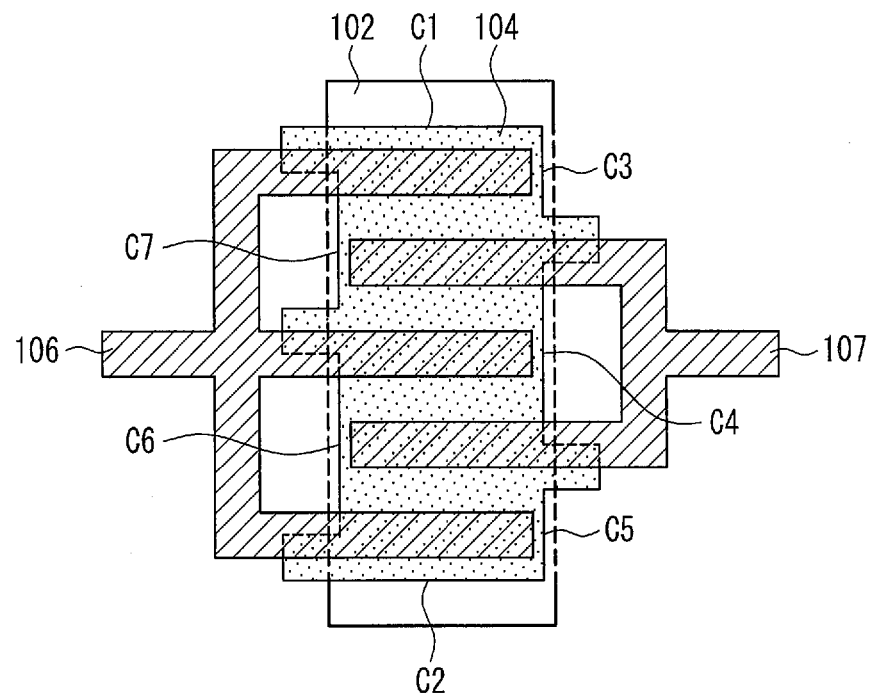

In the example shown in FIG. 10G, the gate electrode 102 is formed so as to extend outside the semiconductor layer 104, not only in the direction perpendicular to the linear portions of the source electrode 106, but also in the extending direction of the linear portions of the source electrode 106. Adjustment portions C3, C4, C5 are formed near tips of the linear portions of the source electrode 106, and adjustment portions C7, C8 are formed near tips of the linear portions of the drain electrode 107.

Figure 10H:
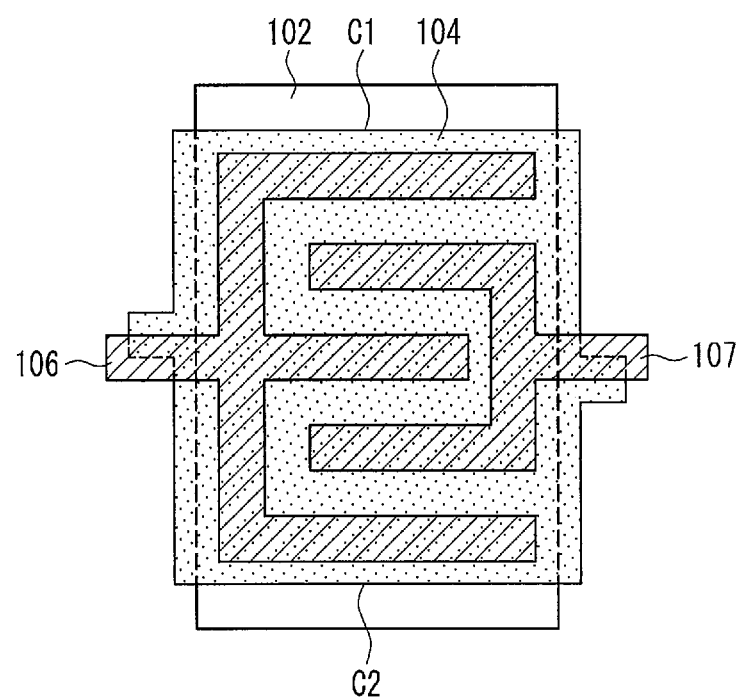

In FIG. 10H, on the semiconductor layer 104 and the gate electrode 102, a region is placed that includes not only the section where the linear portions of the source electrode 106 and the linear portions of the drain electrode 107 are arranged alternately, but also the portion of the source electrode 106 that connects the linear portions of the source electrode 106 to each other and the portion of the drain electrode 107 that connects the linear portions of the drain electrode 107 to each other. The gate electrode 102 is formed so as to extend more outward than the semiconductor layer 104 in the direction perpendicular to the linear portions of the source electrode 106 or the drain electrode 107.

In all of the examples shown in FIGS. 10A-10H described above, the gate electrode 102, the semiconductor layer 104, the source electrode 106 and the drain electrode 107 are formed so that at least part of a path from a certain point of the source electrode 106 to a certain point of the drain electrode 107 via the semiconductor layer 104 always runs above the gate electrode 102. Formation of the adjustment portion means connection of a certain point in the overlapping region of the source electrode 106 and the semiconductor layer 104 to a certain point in the overlapping region of the drain electrode 107 and the semiconductor layer 104, and formation of the semiconductor layer 104 so that the line that runs on the semiconductor layer 104 always runs on the gate electrode 102. In other words, by forming the semiconductor layer 104 so that no path (leak path) is present that runs only on the semiconductor layer 104 without running on the gate electrode 102 from the point in the overlapping region of the source electrode 106 and the semiconductor layer 104 to the point in the overlapping region of the drain electrode 107 and the semiconductor layer 104, the channel region can be secured and characteristics of the thin film transistor 18 can be improved or stabilized.

Figure 11A:
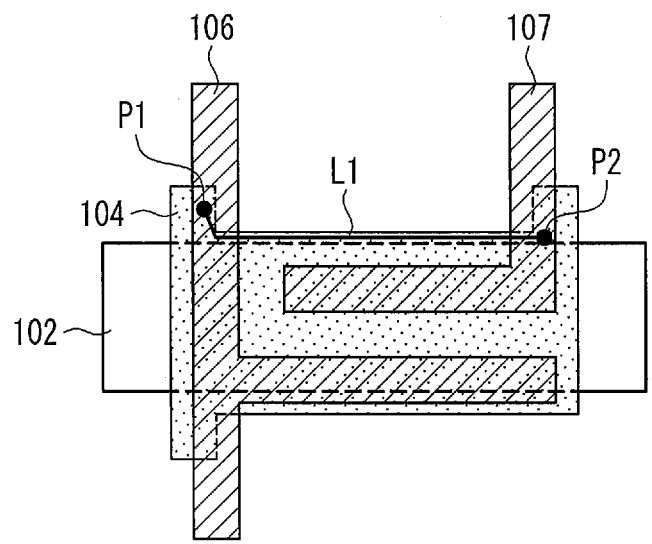
FIGS. 11A-11D are views showing configuration examples including a leak path.

For example, as shown in FIG. 11A, a path L1, which connects a point P1 in the overlapping region of the source electrode 106 and the semiconductor layer 104 to a point P2 in the overlapping region of the drain electrode 107 and the semiconductor layer 104 via the semiconductor layer 104, does not runs on the gate electrode 102. For eliminating such a path L1, the adjustment portion C1 or C2 can be formed as shown in FIG. 10B or 10C, for example. By providing the adjustment portion C1 or C2, the OFF current can be reduced and characteristics of the thin film transistor 18 can be improved.

Figure 11B:
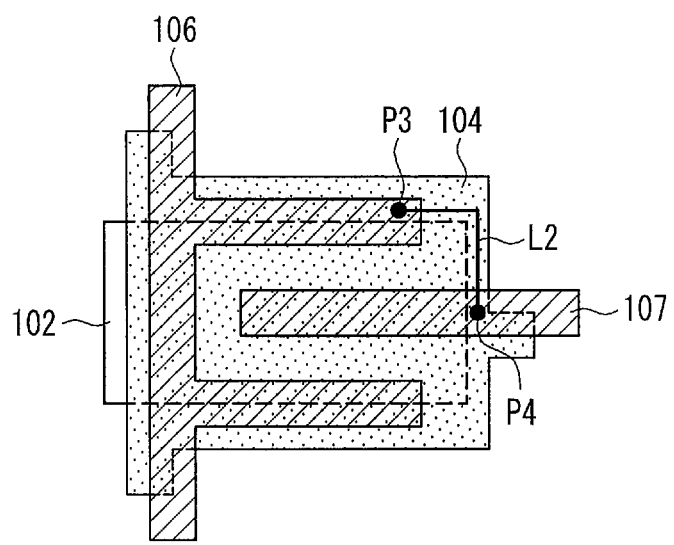

Also in the configuration shown in FIG. 11B, there is a path L2 that does not run on the gate electrode 102 from a point P3 in the source electrode 106 to a point P4 in the drain electrode 107 via the semiconductor layer 104. By adopting a configuration that can eliminate such a line (e.g., the configuration shown in FIG. 10D), the OFF current can be reduced.

Figure 11C:
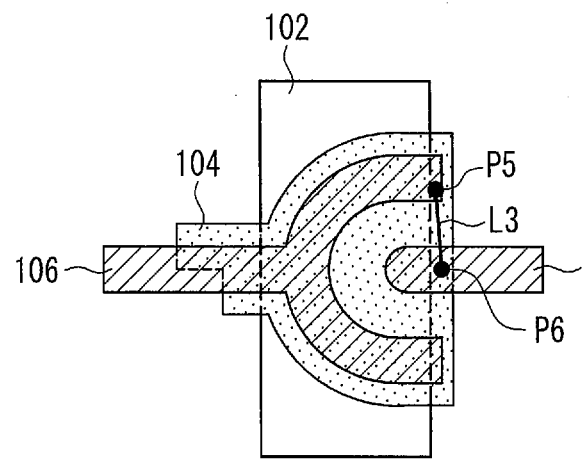

Also in the configuration shown in FIG. 11C, there is a path L3 that does not run on the gate electrode 102 from a point P5 in the source electrode 106 to a point P6 in the drain electrode 107 via the semiconductor layer 104. By adopting a configuration that can eliminate such a line (e.g., the configuration shown in FIG. 10E), the OFF current can be reduced.

Figure 11D:
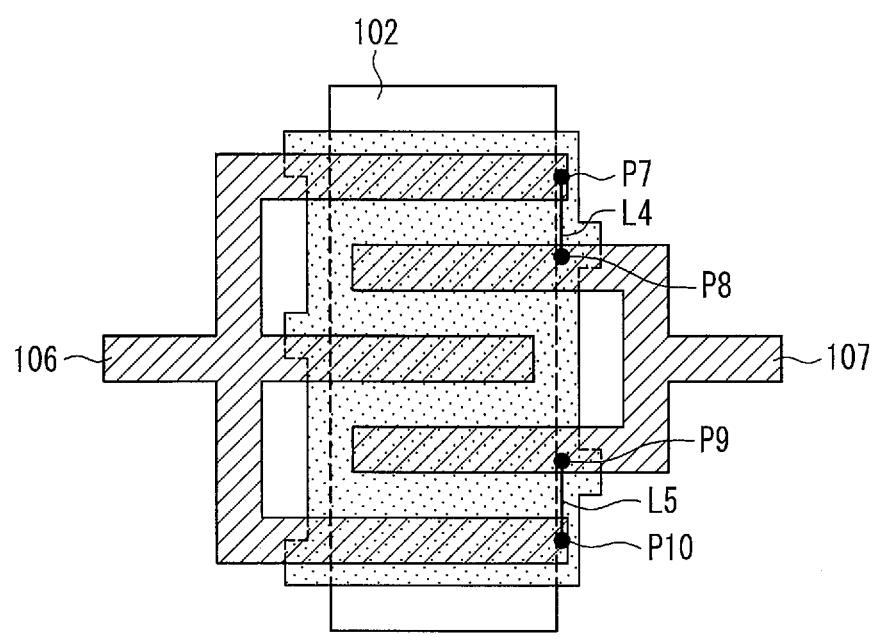

Also in the configuration shown in FIG. 11D, there is a path L4 that does not run on the gate electrode 102 from a point P7 in the source electrode 106 to a point P8 in the drain electrode 107 via the semiconductor layer 104. Further, there is a path L5 that runs on the semiconductor layer 104 and does not run on the gate electrode 102 from a point P9 in the drain electrode 107 to a point P10 in the source electrode 106. By adopting a configuration that can eliminate such a line (e.g., the configuration shown in FIG. 10F, 10G or 10H), the OFF current can be reduced.

Embodiment 2

Figure 12:
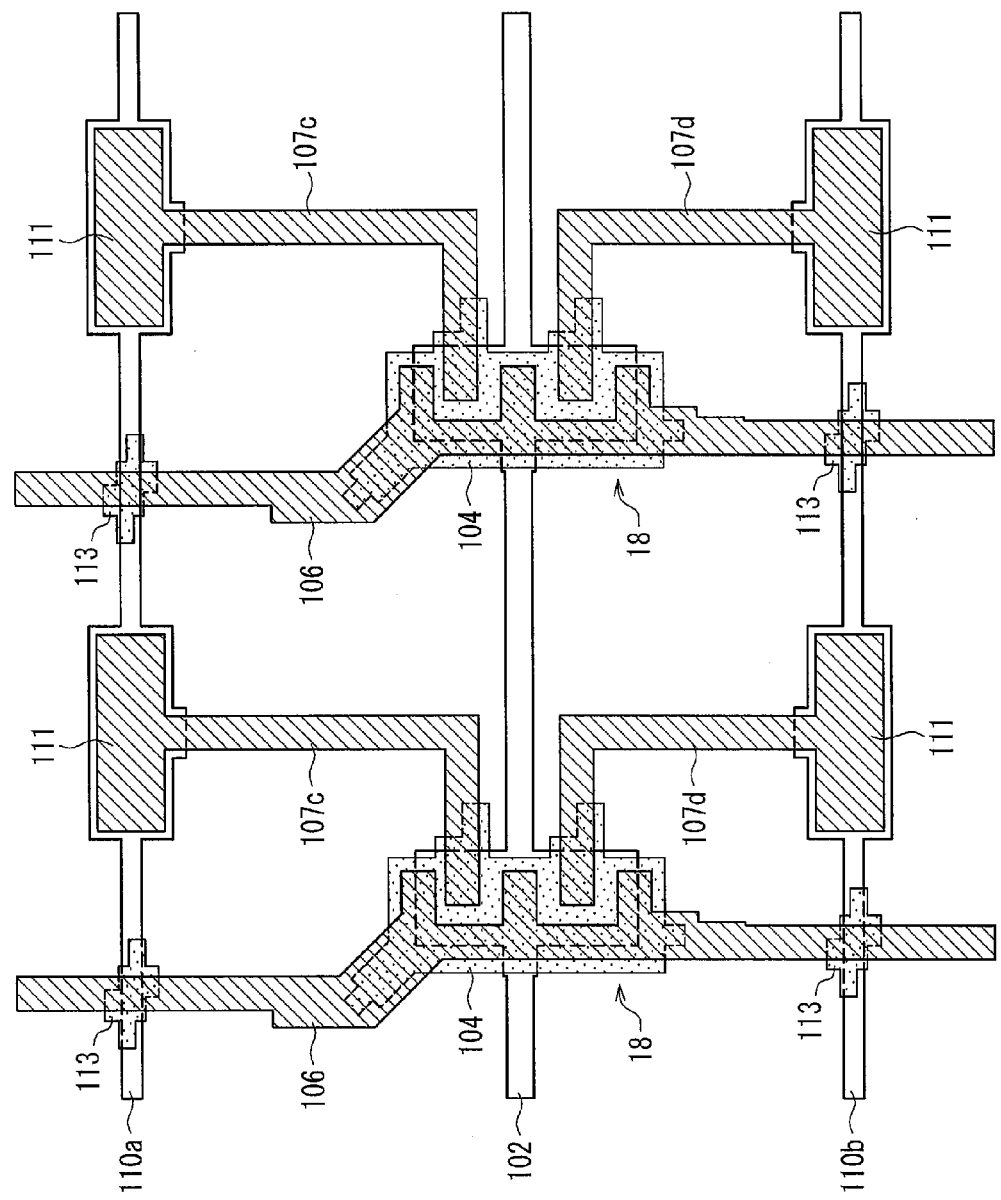
FIG. 12 is a plan view showing a configuration example of a thin film transistor according to Embodiment 2.

FIG. 12 is a plan view showing a configuration example of thin film transistors according to Embodiment 2. FIG. 12 shows a configuration example of two thin film transistors 18 adjacent to each other on the active matrix substrate 5 and a configuration example of the peripheral lines. Each of the thin film transistors 18 includes the gate electrode 102, the semiconductor layer 104 formed on the gate electrode 102, the source electrode 106 formed in a comb shape, and two drain electrodes 107c, 107d opposed to each other with the source electrode 106 and the channel region interposed therebetween. Drain lines are drawn out respectively from the drain electrodes 107c, 107d so as to be connected to pixel electrodes (not shown). As described above, by forming the source electrode 106 and the plurality of the drain electrodes 107c, 107d corresponding to the source electrode 106 on the gate electrode 102 and the semiconductor layer 104 and drawing out the drain lines from the respective drain electrodes 107c, 107d, characteristic deteriorations due to misalignment can be suppressed further.

In the present embodiment, the gate line connected to the gate electrode 102 is formed so as to extend in a horizontal direction of a display screen, and the source line connected to the source electrode 106 is formed so as to extend in a perpendicular direction of the display screen. The two drain electrodes 107c, 107d are arranged symmetrically about the extending direction of the gate line.

The gate line transmits a scanning signal (gate signal) that switches ON and OFF the gate electrode 102 of the thin film transistor 18. The source line transmits a data signal (voltage signal (gradation voltage)) in accordance with brightness (gradation) of the display image output from the source driver 16. The drain line connects the drain electrodes 107c, 107d and the pixel electrodes.

Further, auxiliary capacitance lines 110a, 110b parallel to the gate electrode 102 are provided. The auxiliary capacitance lines 110a, 110b are lines for generating a predetermined auxiliary capacitance per pixel and formed in the same layer as the gate line so as to be parallel to the gate line. Further, the auxiliary capacitance lines 110a, 110b are made of, e.g., the same two-layered metallic film as that of the gate line, and the ends are connected to a drive portion of the auxiliary capacitance (e.g., the above-described source driver 16).

The drain lines are connected also to auxiliary capacitance electrodes 111 provided above the auxiliary capacitance lines 110a, 110b. Further, a contact hole for connection to the pixel electrode may be provided above the auxiliary capacitance electrode 111.

The gate insulating film 103 (see FIGS. 4A-4C) is provided between the auxiliary capacitance electrode 111 and the auxiliary capacitance line 110a. At the overlapping portion of the auxiliary capacitance electrode 111 and the auxiliary capacitance line 110a, the auxiliary capacitance line 110a preferably is arranged so as to be located inside the auxiliary capacitance electrode 111. In other words, the auxiliary capacitance line 110a preferably is set smaller than the auxiliary capacitance electrode 111.

The auxiliary capacitance line 110a also crosses the source line. At an intersection of the auxiliary capacitance line 110a and the source line, a semiconductor layer 113 is provided further between the auxiliary capacitance line 110a and the source line. The semiconductor layer 113 has a protrusion T that protrudes along the extending direction of the source line. Thereby, it is possible to suppress disconnection of the source line or the auxiliary capacitance lines 110a, 110b due to misalignment.

In the example shown in FIG. 12, at the intersections of the source lines and the auxiliary capacitance lines 110a, 110b, the semiconductor layers 113 are provided. However, semiconductor layers can be provided similarly at intersections of the source lines and other lines. Further, not only at the source lines but also at intersections of the drain lines and other lines, semiconductor layers can be provided similarly. Thereby, it is possible to suppress disconnection due to misalignment.

The present invention is not limited to the above-described Embodiments 1 and 2. For example, the gate electrode, the source electrode and the drain electrode are not limited to the above-described two-layered metallic film. For example, the electrodes can be made of a monolayer film or a laminated film or an alloy or an alloy laminated film of metals such as Al, Mo, Ti and Ta. Further, the semiconductor layer is not limited to amorphous Si, and may be formed of an oxide semiconductor such as μc-Si, ZnO, IGZO, for example.

Further, the semiconductor device of the present invention is applicable not only to liquid crystal display devices, but also to various display devices provided with substrates having lines for controlling pixels. For example, the present invention is applicable to a PDP, a FED (Field Emission Display), an organic EL, an inorganic EL, and electric-field-induced display devices such as an electrowetting type, an electroosmotic type, an electrophoretic type, or a dielectrophoretic type.

INDUSTRIAL APPLICABILITY

The present invention is industrially applicable as a semiconductor device, an active matrix substrate or a display device, for example.

DESCRIPTION OF REFERENCE NUMERALS 18 thin film transistor
101 base material (substrate)
102 gate electrode
103 gate insulating film
104 semiconductor layer
105 electrode contact layer
106 source electrode
107 drain electrode
108 protective layer
109 interlayer insulating film

The invention claimed is:

1. A semiconductor device, comprising:
a gate electrode arranged on a substrate;
a semiconductor layer arranged above the gate electrode and including a source region, a drain region, and a channel region;
a source electrode connected to the source region above the semiconductor layer; and
a drain electrode connected to the drain region above the semiconductor layer, wherein
the semiconductor layer includes, at a portion overlapping the drain electrode, a protrusion that protrudes outward along an extending direction of a drain line that is drawn out from the drain electrode,
the protrusion includes at least one point of inflection at a portion of the protrusion overlapping the drain electrode, and
at an outside of the channel region sandwiched between the drain electrode and the source electrode, the semiconductor layer includes an adjustment portion where an outer boundary of the semiconductor layer is positioned more inward than an outer boundary of the gate electrode.

2. The semiconductor device according to claim 1, wherein the semiconductor layer further includes, at a portion overlapping the source electrode, a protrusion that protrudes outward along an extending direction of the source line that is drawn out from the source electrode.

3. The semiconductor device according to claim 1,
wherein, at a section where a source line drawn out from the source electrode or a gate line drawn out from the gate electrode crosses another line, a semiconductor layer is provided further between the another line and the source line or the gate line, and
the semiconductor layer includes a protrusion that protrudes along an extending direction of the source line or the gate line.

4. The semiconductor device according to claim 1, wherein the source electrode or the drain electrode is wider than the source line or the drain line, at a portion overlapping the protrusion of the semiconductor layer.

5. The semiconductor device according to claim 1, wherein the gate electrode includes a portion that extends outside a region sandwiched between the source electrode and the drain electrode and protrudes more outward than the semiconductor layer.

6. The semiconductor device according to claim 1, wherein, in the semiconductor layer, the protrusion and the adjustment portion are continuously defined.

7. The semiconductor device according to claim 1, wherein one of the source electrode and the drain electrode includes a linear portion, and is arranged opposite to the other electrode so that both sides of the linear portion is surrounded by the other electrode.

8. The semiconductor device according to claim 1,
wherein a plurality of the drain electrodes or a plurality of the source electrodes are provided above the gate electrode via the semiconductor layer, and
drain lines or source lines respectively are drawn out from the plurality of the drain electrodes or the plurality of the source electrodes.

9. An active matrix substrate provided with the semiconductor device according to claim 1.

10. A display device provided with the semiconductor device according to claim 1.

11. A semiconductor device, comprising:
a gate electrode arranged on a substrate;
a semiconductor layer arranged above the gate electrode and including a source region, a drain region, and a channel region;
a source electrode connected to the source region above the semiconductor layer; and
a drain electrode connected to the drain region above the semiconductor layer, wherein
the semiconductor layer includes, at a portion overlapping the source electrode, a protrusion that protrudes outward along an extending direction of a source line that is drawn out from the source electrode,
the protrusion includes at least one point of inflection at a portion of the protrusion overlapping the source electrode, and
at an outside of the channel region sandwiched between the drain electrode and the source electrode, the semiconductor layer includes an adjustment portion where an outer boundary of the semiconductor layer is positioned more inward than an outer boundary of the gate electrode.

12. The semiconductor device according to claim 11, wherein the semiconductor layer further includes, at a portion overlapping the source electrode, a protrusion that protrudes outward along an extending direction of the source line that is drawn out from the source electrode.

13. The semiconductor device according to claim 11,
wherein, at a section where a source line drawn out from the source electrode or a gate line drawn out from the gate electrode crosses another line, a semiconductor layer is provided further between the another line and the source line or the gate line, and
the semiconductor layer includes a protrusion that protrudes along an extending direction of the source line or the gate line.

14. The semiconductor device according to claim 11, wherein the source electrode or the drain electrode is wider than the source line or the drain line, at a portion overlapping the protrusion of the semiconductor layer.

15. The semiconductor device according to claim 11, wherein the gate electrode includes a portion that extends outside a region sandwiched between the source electrode and the drain electrode and protrudes more outward than the semiconductor layer.

16. The semiconductor device according to claim 11, wherein, in the semiconductor layer, the protrusion and the adjustment portion are continuously defined.

17. The semiconductor device according to claim 11, wherein one of the source electrode and the drain electrode includes a linear portion, and is arranged opposite to the other electrode so that both sides of the linear portion is surrounded by the other electrode.

18. The semiconductor device according to claim 11,
wherein a plurality of the drain electrodes or a plurality of the source electrodes are provided above the gate electrode via the semiconductor layer, and
drain lines or source lines respectively are drawn out from the plurality of the drain electrodes or the plurality of the source electrodes.

19. An active matrix substrate provided with the semiconductor device according to claim 11.

20. A display device provided with the semiconductor device according to claim 11.

* * * * *